US006445722B2

(12) United States Patent
Hamamoto (10) Patent No.: US 6,445,722 B2
(45) Date of Patent: *Sep. 3, 2002

(54) SINGLE-TRANSVERSE-MODE LASER DIODE WITH MULTI-MODE WAVEGUIDE REGION AND MANUFACTURING METHOD OF THE SAME

(75) Inventor: Kiichi Hamamoto, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/053,362

(22) Filed: Apr. 1, 1998

(30) Foreign Application Priority Data

Aug. 18, 1997 (JP) .............................. 9-221422

(51) Int. Cl.$^7$ .............................. H01S 5/00; H01S 5/20
(52) U.S. Cl. .......................................... 372/46; 372/45
(58) Field of Search ............................. 372/43, 44, 45, 372/46, 50, 23; 385/28–29; 438/31, 35, 39

(56) References Cited

U.S. PATENT DOCUMENTS

| | | | | | |
|---|---|---|---|---|---|
| 4,689,797 | A | * | 8/1987 | Olshansky | 372/45 |
| 4,783,788 | A | * | 11/1988 | Gordon | 372/45 |
| 4,827,483 | A | * | 5/1989 | Fukuzawa et al. | 372/45 |
| 5,333,142 | A | * | 7/1994 | Scheps | 372/22 |

FOREIGN PATENT DOCUMENTS

| | | | |
|---|---|---|---|
| JP | 59-195895 | 11/1984 | ............. H01S/3/18 |
| JP | 62-108590 | 5/1987 | ............. H01S/3/18 |
| JP | 62291604 | 12/1987 | |
| JP | 2-78291 | 3/1990 | ............. H01S/3/18 |
| JP | 6-174952 | 6/1994 | |
| JP | 6-235833 | 8/1994 | |
| JP | 10-270791 | 10/1998 | ............. H01S/3/18 |

OTHER PUBLICATIONS

Japanese Office Action dated Dec. 21, 1999 with partial translation.
K. Hamamoto et al, "Single–Transverse–Mode Active MMI 1.5 $\mu$m–InGaAsP Buried–Hereto Laser Diode", ECIO '97 8th European Conference on Integrated Optics and Technical Exhibition, Postdeadline Papers, Apr. 2, 1997, pp. PD5–1–PD5–4.
M. Sagawa et al., "High–Power, Highly–Reliable Operation of InGaAs/InGaAsP 0.98 $\mu$m Lasers with an Exponential–Shaped Flared Stripe", Electronics Letters, vol. 32, No. 24, Nov. 21, 1996, pp. 2277–2279.
P. Vankwikelberge et al., "Local Normal Mode Analysis of Index–Guided AlGaAs Lasers with Mode Filter", IEEE Journal of Quantum Electronics, vol. QE–23, No. 6, Jun. 1987, pp. 730–737.
L. Soldano et al., "Optical Multi–Mode Interference Devices Based on Self–Imaging: Principles and Applications", Journal of Lightwave Technology, vol. 13, No. 4, Apr. 1995, pp. 615–627.
L. Mawst et al., "Resonant Self–Aligned–Stripe Antiguided Diode Laser Array", Applied Physics Letters, vol. 60, No. 6, Feb. 1992, pp. 668–670.

* cited by examiner

*Primary Examiner*—Quyen Leung
(74) *Attorney, Agent, or Firm*—Sughrue Mion, PLLC (57) ABSTRACT

A laser diode with a single-transverse-mode output having a laser cavity comprising both single-mode and multi-mode waveguide portions, and a method of manufacturing such a laser diode are disclosed. There are a pair of single transverse waveguide regions at opposite ends of a multi-mode waveguide. The multi-mode waveguide is a 1×1-multi-mode interference waveguide, with a wider width than the single-mode portions. Use of the multi-mode region improves the power output, threshold current density, and overall efficiency in comparison to a similarly constructed laser diode in which the entire laser cavity is single-mode.

6 Claims, 8 Drawing Sheets

SINGLE-TRANSVERSE-MODE LASER DIODE WITH MULTI-MODE WAVEGUIDE REGION AND MANUFACTURING METHOD OF THE SAME

BACKGROUND OF THE INVENTION

1. Field of the Invention

The present invention relates to a laser diode and a manufacturing method of the same, and more particularly to a single-mode laser diode comprising a light waveguide including a multi-mode waveguide region and a manufacturing method of the same.

2. Description of the Related Art

Opto-electronics technologies have been utilized and developed in various fields such as the information input/output technologies typified by compact discs hereinafter referred to as CDs) and the optical communication technologies using optical fibers, and so on. Laser diodes, (hereinafter referred to as LDs), have been developed as devices which support these opto-electronics technologies. For example, LDs of near infrared band or visible band are used for CDs and LDs of long wave band are used for optical communications. As described above, various kinds of LDs contribute to the opto-electronics technologies.

There are various structures of LDs. Among waveguide type LDs, the waveguide type LDs having a waveguide which obtains a so-called single-transverse-mode light are generally used. Concerning CDs, in order to increase the capacity of information, it is important to increase the recording density. And it is necessary to use single-transverse-mode light to increase the recording density. Moreover, with regard to optical communications, there is a problem that the multi-mode signal light is not suitable for long distance communication because of the influence of multi-mode dispersions. For this reason, a waveguide type LD which emits single-transverse-mode light is generally used in both the field of the information input/output and the field of the optical communications.

In order to obtain this single-transverse-mode light, from the waveguide of the LDs, a single-transverse-mode waveguide which has a narrow waveguide width to cut off the multi-mode light is generally used. More concretely, in the single-transverse-mode waveguide, the width of the active layer in the waveguide of the LD is limited in the range of about 2 to 4 $\mu$m. Therefore, an electric current capable of being injected into the LD is limited to a relatively small value so that there is a limitation to an output of light.

In order to allow a high injection electric current and to enhance a saturation light output level, one of the easiest ways is to widen the waveguide width of the LD. However, as described above, since there is the limitation that the waveguide width must be relatively narrow in order to realize the single-transverse-mode waveguide, a technological restriction for achieving a high output performance of the LDs exists.

In order to solve the foregoing problems, various kinds of methods have been proposed. A mode-filter integrated multi-mode LD is reported in IEEE Journal of Quantum Electronics Vol. QE-23 No.6, 1987, pages 730–737, by Patrick Vanwikelberge et. al. ( hereinafter referred to as the first prior art). In this multi-mode LD, a main light excitation region is constituted by a multi-mode LD having a wide waveguide width, resulting in an increase in a saturation light output performance.

As another way, a flare-shaped LD is reported in Electronics Letters Vol. 32, No. 24, 1996, pages 2277–2279, by M. Sagawa et. al. ( hereinafter referred to as the second prior art This LD has a structure in which a waveguide width is as narrow as the width of the single-transverse-mode waveguide in its one end and the waveguide width becomes broader toward its other end showing a flare shape. Since the waveguide width in its broader end is broader than conventional single-transverse-mode waveguides, the light output performance is increased. In addition, since the mode of the output light is controlled by the single-transverse-mode waveguide region at the narrow end, the foregoing LD can be constructed such that it can keep the single-transverse-mode light in spite of the broader width in its other end, by forming it to the desirable flare shape.

Moreover, as another way, a Phase-locked LD array is reported in Applied Physics Letters Vol. 60, No. 6, 1992, pages 668–670, by L. J. Mawst et. al. ( hereinafter referred to as the third prior art). This LD array has a plurality of LDs, for example, 20 LDs, which are integrated by arranging them perpendicular to the direction of the its light waveguide at certain intervals and the LDs are allowed to resonate with each other, thereby finally achieving a high single-transverse-mode output.

In the first prior art, though the multi-mode waveguide region excites not only the single-transverse-mode light but also primary and secondary lights, the single-transverse-mode light can be obtained by removing the primary and secondary lights by mode filters. Since light energies of the primary and secondary lights do not contribute to the single-transverse-mode light output of the LD, there is a problem that an electric/light conversion efficiency is low compared to the conventional single-transverse-mode LD.

From the view point of manufacturing the LD, the second prior art involves a disadvantage of difficulty in forming a desirable flare shape. Specifically, in the case that the length of the LD involves a little error or the broader end of the waveguide is not formed exactly according to the design due to an error in manufacturing, the flare shape is no longer the most desirable one. In this case, the desired characteristics of the LD can not be obtained.

The third prior art has a complicated structure and involves a difficulty in manufacturing so that it is difficult to manufacture the LD array with a high yield. Moreover, in the third prior art, a structural tolerance to satisfy the resonance conditions is severe, that is, the allowable range of the error of the third prior art is narrow, so that it is difficult to manufacture the LD array with a high reproducibility.

As described above, the allowable injection electric current into the LD having a narrow waveguide width to obtain the single-transverse-mode light, which has been heretofore used in general, is limited to a small quantity, so that there is a problem of limitation of the output of the LD. The three prior arts that have been proposed in order to solve these problems involve the problems that it is difficult to obtain the high electric/light conversion efficiency, the LD can not be manufactured with a high reproducibility, the manufacturing tolerance is severe, and the structures are complicated.

SUMMARY OF THE INVENTION

It is an object of the present invention to provide a LD which has a simple structure which can be manufactured easily and is capable of obtaining a single-transverse-mode light with a high power output, and a manufacturing method of the same.

The present invention features that a LD for emitting single-transverse-mode light comprises a light waveguide including a multi-mode waveguide region. The multi-mode waveguide region should preferably be a 1×1 multi-mode interference light waveguide. It is preferable that a light waveguide structure consist of a multi-mode waveguide region and a pair of single-transverse-mode waveguide regions connected to both ends of the multi-mode waveguide region. It is preferable that the width of the multi-mode waveguide region be wider than that of the single-transverse-mode waveguide region. When the multi-mode waveguide region is formed, it is preferable that its width W1 be set to any value, the length L corresponding to the width W1 obtained by a multi-mode interference theory, and then a multi-mode waveguide region having the length L and the width W1 formed.

With such structure, the LD of the present invention comprises a multi-mode waveguide having a broad width as a main waveguide structure so that the LD of the present invention can achieve an increase in a light output, a low threshold electric current density and a high electric/light conversion efficiency. At the same time, the LD of the present invention can realize a single-transverse-mode output light. Moreover, the LD of the present invention has a comparatively simple structure so that it can be manufactured at a high yield and with a good reproducibility.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1:
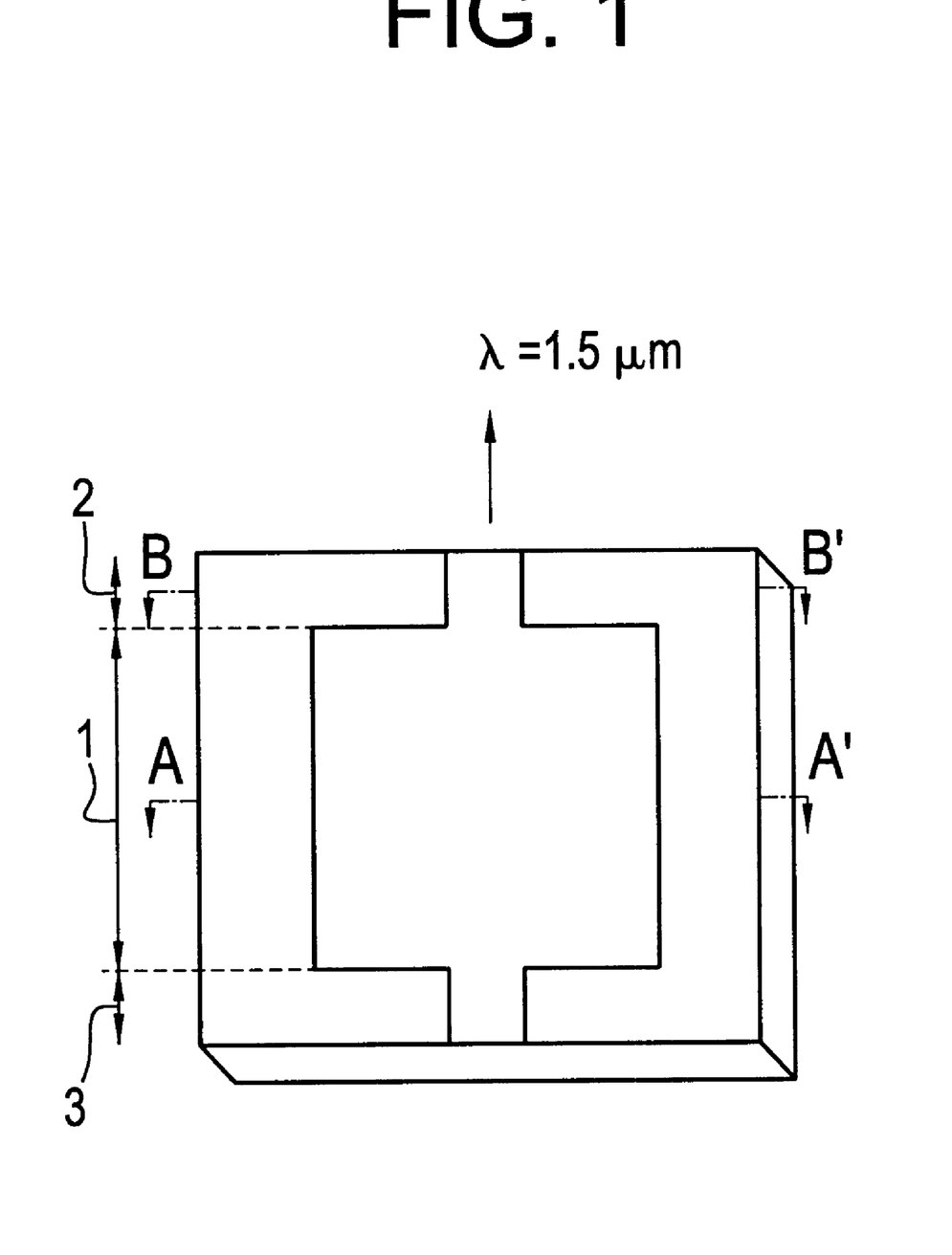
FIG. 1 is a schematic perspective view showing a LD of an embodiment of the present invention.
Figure 2A:
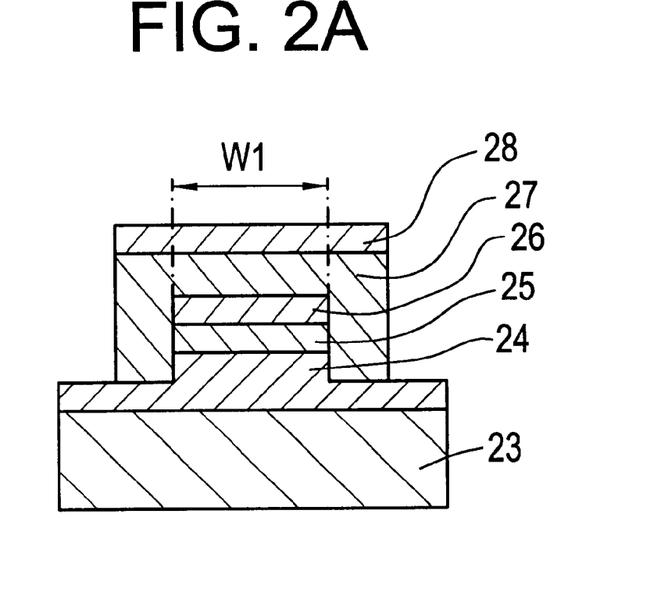
FIG. 2A is a sectional view of the multi-mode waveguide region of the LD in FIG. 1, taken along the dashed line A–A'.
Figure 2B:
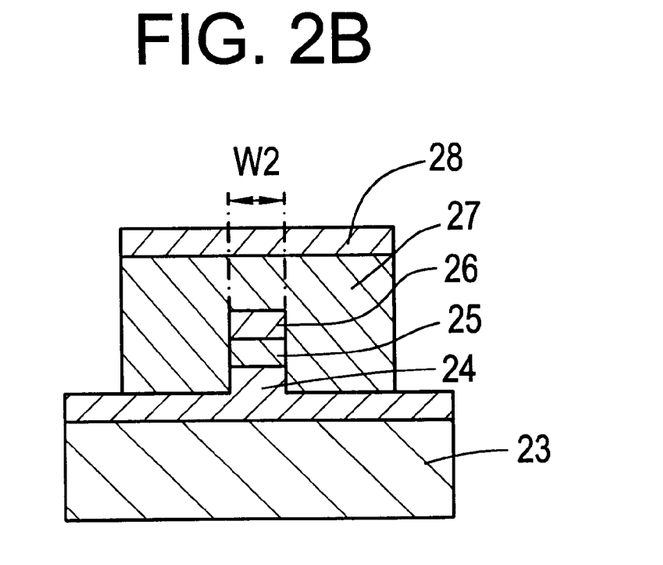
FIG. 2B is a sectional view of the single-transverse mode waveguide region of the LD in FIG. 1, taken along the dashed line B–B'.

Referring to FIG. 1, an embodiment of the present invention is a 1.5 µm LD consisting of a multi-mode waveguide region 1 and single-transverse-mode waveguide regions 2 and 3 connected to both ends of multi-mode waveguide region 1. The length of multi-mode waveguide region 1 is about 280 µm and the length of the single-transverse-mode waveguide regions 2 and 3 is about 50 µm. The length of the element is about 380 µm in total. FIG. 2A shows a layer structure in section taken along the dashed line A–A' (the position within multi-mode waveguide region 1). FIG. 2B shows the layer structure in section taken along the dashed line B–B' (the position within single-transverse-mode waveguide region 2). The layer structures in section taken along the dashed lines A–A' and B–B' shown in FIGS. 2A and 2B are almost the same, but there is a difference only in the widths of the waveguides. Waveguide width W1 of multi-mode waveguide region 1 shown in FIG. 2A is 10 µm and waveguide width W2 of single-transverse-mode waveguide region 2 shown in FIG. 2B is 2 µm. In both FIGS. 2A and 2B reference numeral 23 denotes an n-InP substrate, 24 denotes an n-InP buffer layer, 25 denotes an 1.5 µm composition InGaAsP layer, 26 denotes a p-InP cladding layer, 27 denotes a p-InP buried layer and 28 denotes a p-InGaAs cap layer.

Figure 3A:
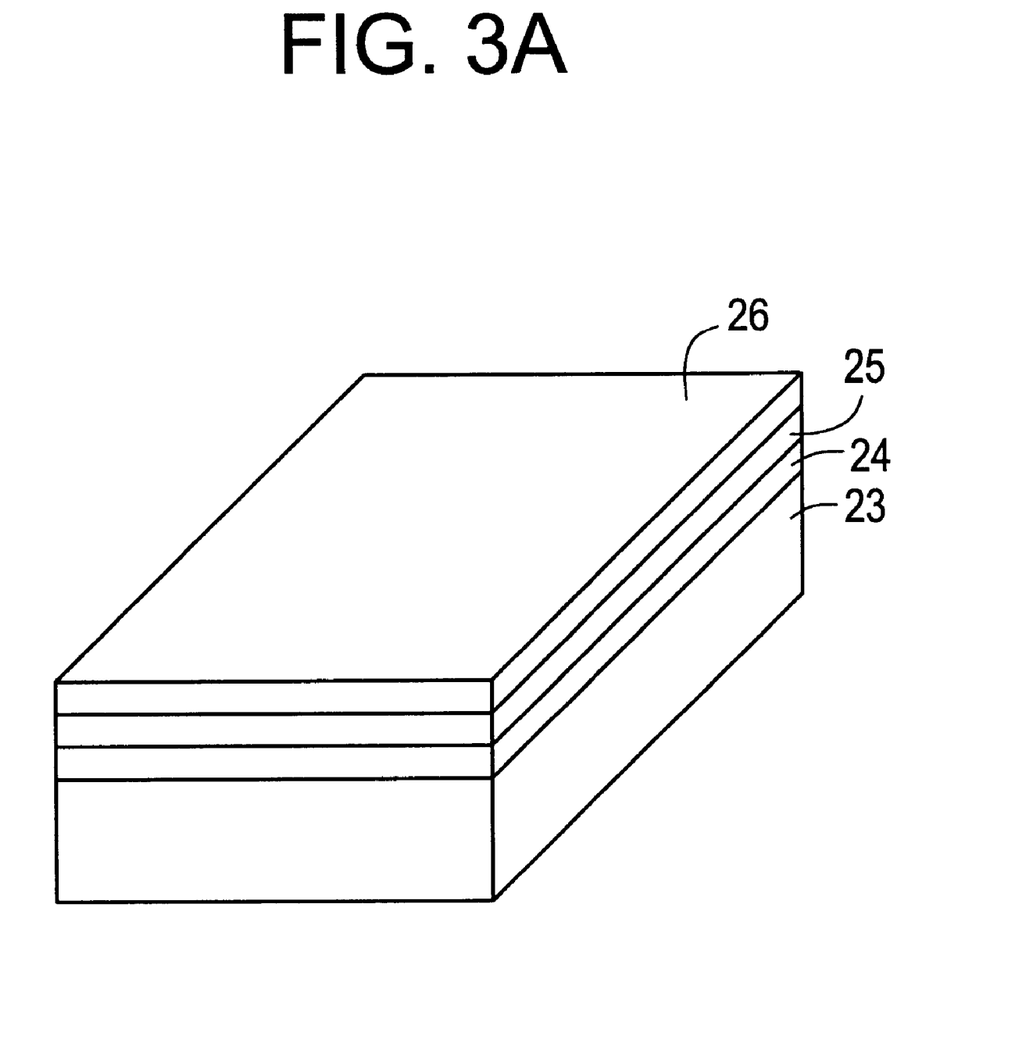
FIGS. 3A to 3E are explanatory views showing first to fifth manufacturing steps of the LD shown in FIG. 1.

Next, a manufacturing method of the LD of an embodiment of the present invention will be described with reference to FIGS. 3A to 3E. Firstly, as shown in FIG. 3A, n-InP buffer layer 24, 1.5 µm composition InGaAsP layer 25, and p-InP cladding layer 26 are sequentially formed on n-InP substrate 23 in this order according to an MOVPE method (metal organic vapor phase epitaxial method). The thicknesses of n-InP buffer layer 24 is about 200 nm, that of 1.5 µm composition InGaAsP layer 25 is about 100 nm, and that of p-InP cladding layer 26 is about 200 nm.

Figure 3B:
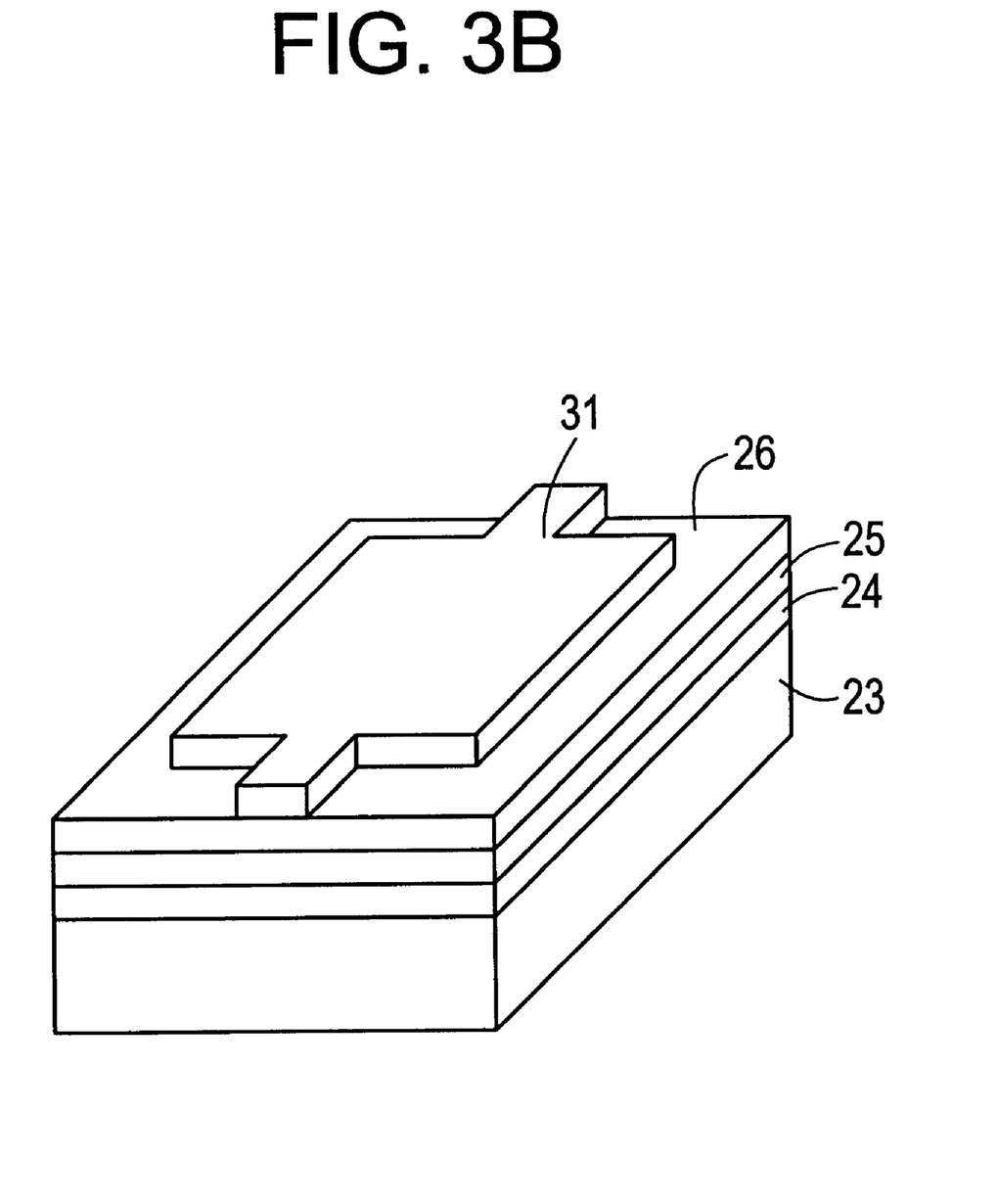
Figure 3C:
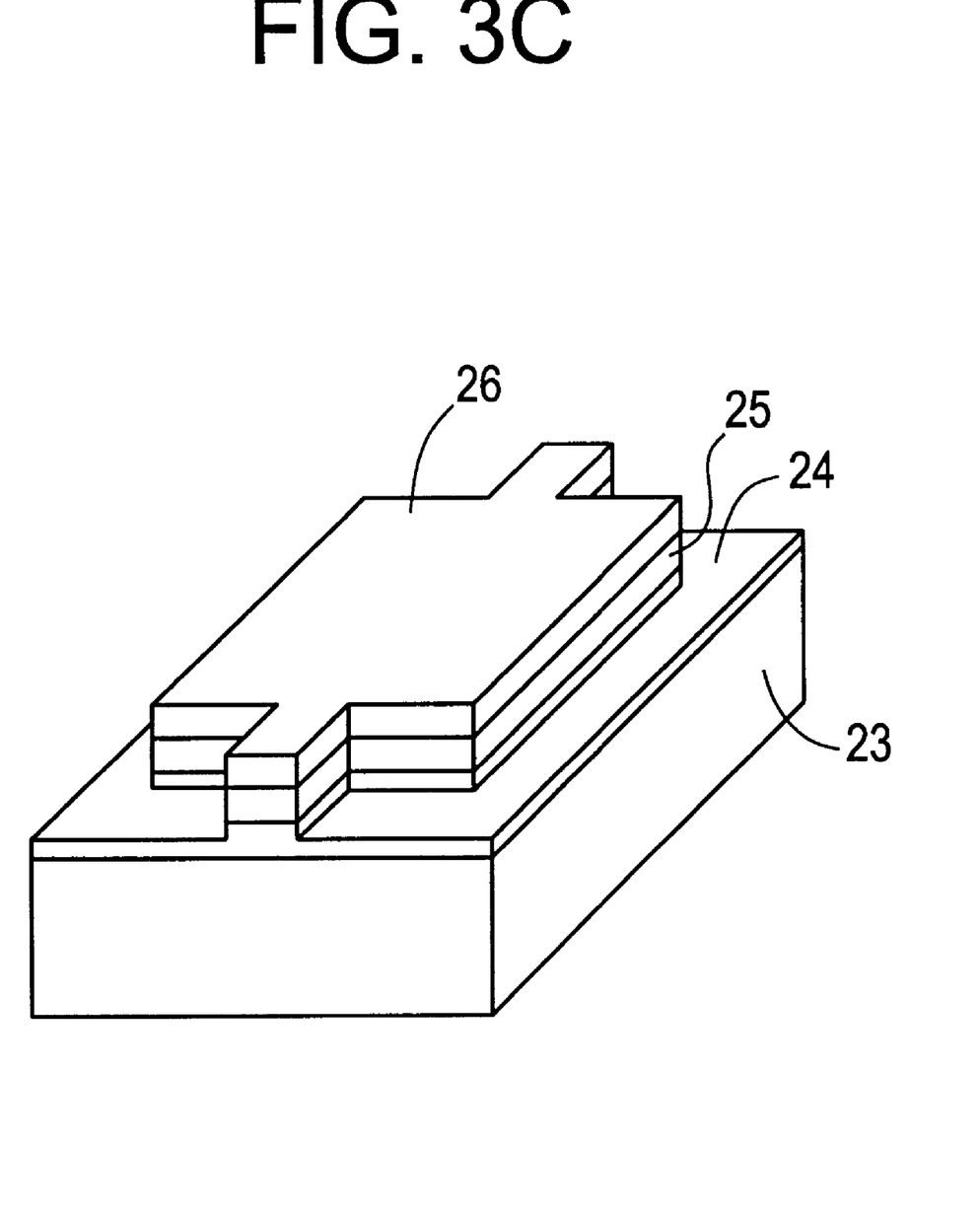

Subsequently, as shown in FIG. 3B, etching mask 31 is formed on p-InP cladding layer 26 by an ordinary photolithography method. Thereafter, as shown in FIG. 3C, p-InP cladding layer 26, 1.5 µm composition InGaAsP layer 25 and n-InP buffer layer 24 (only the portions where mask 31 is not formed) are partially removed by a reactive ion etching method (RIE method), whereby a mesa structure is formed.

Figure 3D:
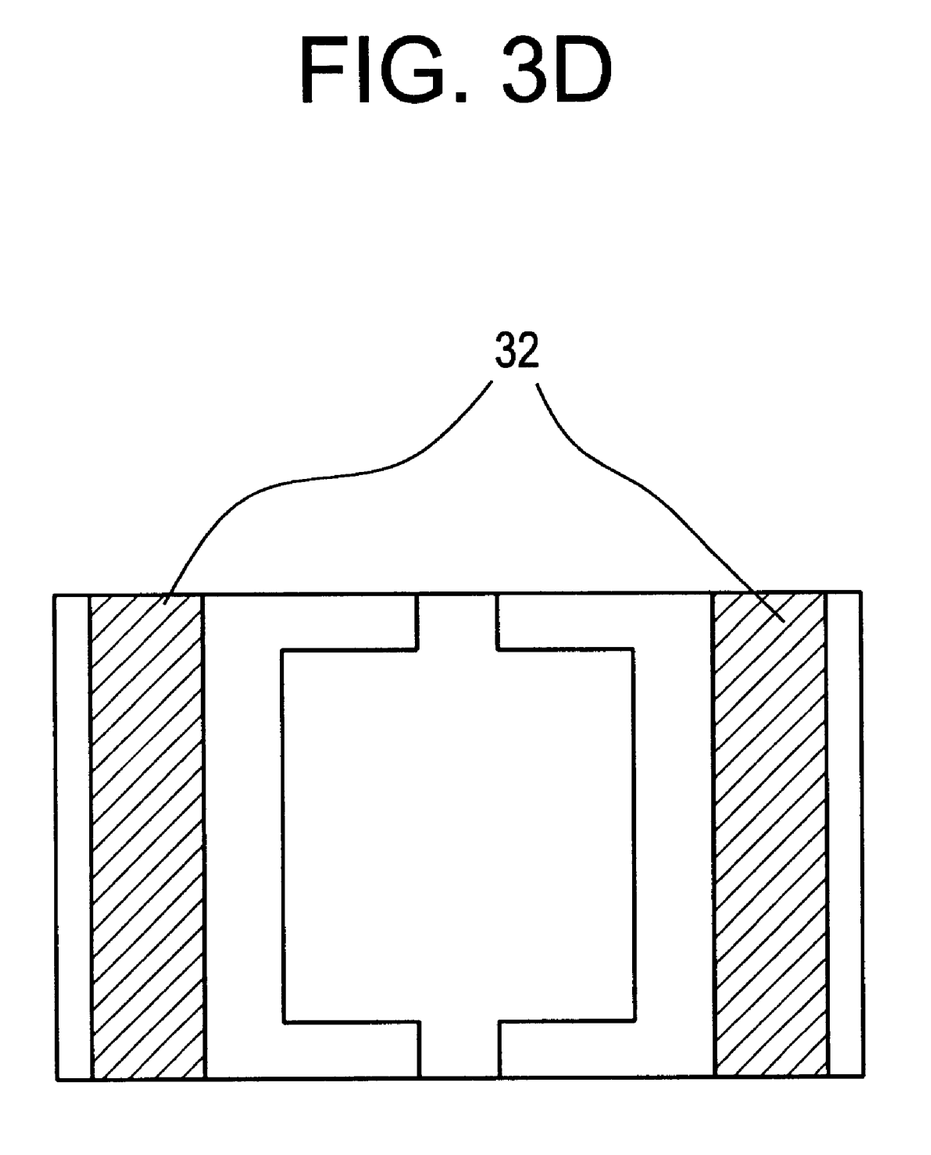
Figure 3E:
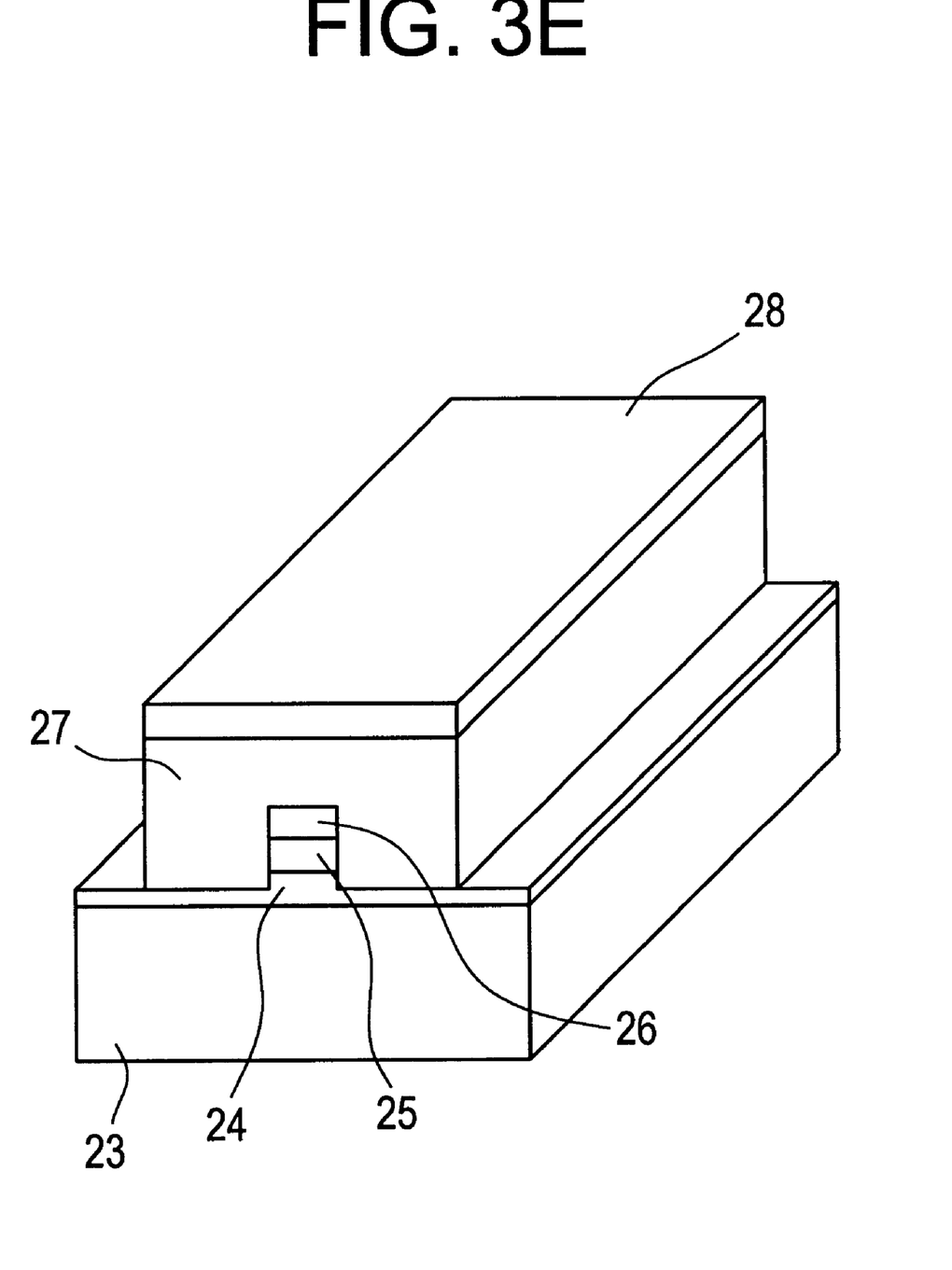

Next, an $SiO_2$ film is formed on the whole surface by an ordinary CVD (Chemical Vapor Deposition) method. Thereafter, as shown in FIG. 3D, by an ordinary photolithography method, an $SiO_2$ mask 32 is formed on both sides of the mesa structure to form the buried layer by a selective crystal epitaxial method. Thereafter, as shown in FIG. 3E, p-InP buried layer 27 and p-InGaAs cap layer 28 are formed by an MOVPE method. The thickness of P-InP buried layer 27 is about 2 µm and that of p-InGaAs cap layer 28 is about 200 µm.

Then, the rear surface of this element (the rear surface of n-InP substrate 23) is polished and the rear surface electrode and front surface electrode are formed by an ordinary sputtering method (not shown). Subsequently, the element is cleaved to a desirable size and shape and an ordinary anti-reflection (AR) coating and an ordinary half-reflection (HR) coating are coated on the cleaved end surfaces. Thus, the manufacturing of the LD is completed.

The characteristics of such an LD will subsequently be described. The LD of this embodiment has a structure that comprises multi-mode waveguide region 1 as shown in FIG. 1. This multi-mode region is designed to perform 1×1 operation according to MMI (Multi-mode Interference) theory.

This MMI theory has been known as a theory for designing branching/joining passive light waveguides such as 1×N or N×N, which is disclosed, for example, in Journal of Lightware Technology, Vol. 13, No. 4, 1995, pages 615–627, by Lucas B. Soldano. In the generally known MMI theory, the equations (1) to obtain the effective width $W_e$ of the MMI region and the beat length of two lowest-order modes $L_{90}$ which are obtained from two lowest-order modes are shown below.

$$We = W1 + (\lambda_0/\pi)(Nc/Nr)^{2\sigma}(Nr^2 - Nc^2)^{-1/2} \quad (1)$$

$$L_{90} = 4NrWe^2/3\lambda_0$$

Here, W1 is the width of the MM1 region, Nr is a refractive index of the waveguide, Nc is a refractive index of the cladding, $\lambda_0$ is a wavelength of incidence light, σ=0 at a TE mode, σ=1 at a TM mode.

Therefore, W1 is firstly set to a desirable width to obtain a high output and the effective width We of the MMI region is obtained. Next, beat length $L_{90}$ is obtained based on this We.

Here, according to the MMI theory, it has generally been known that when length L of the MMI region satisfies the condition expressed by the following equation (2), the MMI region operates as the 1×N light waveguide.

$$L=(3/4N)L\pi \quad (2)$$

Moreover, it has generally been known that when length L satisfies the condition expressed by the following equation (3), the MMI region operates as the N×N light waveguide.

$$L=(3/N)L_\pi \quad (3)$$

It should be noted that N is a positive integer.

Utilizing the principle of the MMI theory that is known conventionally, length L of the MMI region in order to obtain the 1×1-MMI light waveguide having the desired width W1 can be obtained by substituting the value of $L_\pi$ and N=1 for the foregoing equations (2) or (3).

In the manner described above, by obtaining an appropriate length L corresponding to a desirable width W1 of the MMI region, even with a multi-mode waveguide with an MMI region of a broad width, it is possible to design the 1×1-MMI light waveguide to realize propagation of only the single-transverse-mode light at both its end surfaces. It should be noted that the calculations may performed by using any of the foregoing equation (2) which shows the condition that the MMI region operates as the 1×N light waveguide and the foregoing equation (3) which shows the condition that the MMI region operates as the N×N light waveguide.

It has been heretofore known that this MMI theory can be applied to the passive waveguide. However, the inventors of the present invention found that 1×1-MMI light waveguide structure based on this MMI theory can be applied also to the light waveguide structure of the LDs by their recent studies and they disclosed this in European Conference on Integrated Optics, '97 8th, Postdeadline Papers, PD-5-1 to PD5-4 pages.

Figure 4:
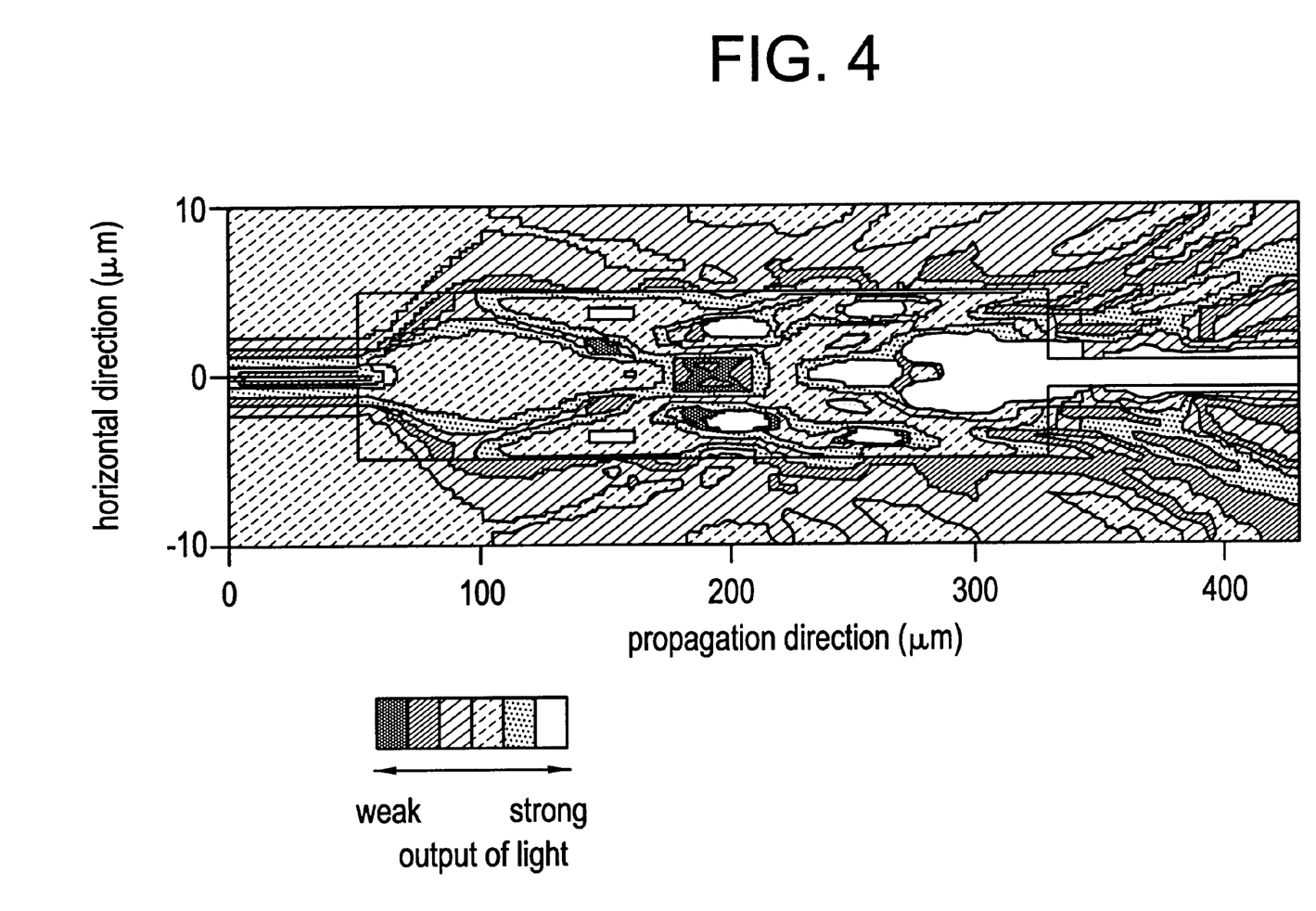
FIG. 4 is a schematic view showing a result obtained by simulating an operation of the LD shown in FIG. 1 by a two dimensional BPM (Beam Propagation Method).

FIG. 4 shows the result of a simulation for the 1×1-MMI light waveguide having a gain of 10 cm$^{-1}$ based on the foregoing MMI theory, which is obtained by a two-dimensional BPM (Beam Propagation Method). FIG. 4 is a drawing in which light energy intensities are illustrated by means of hatching, cross-hatching, and so on. In FIG. 4, the hatching density and the kinds of line are varied according to the light energy intensities. The white plain portions where no hatchings are present show the largest light energy intensity portions. As shown in FIG. 4, it is proved that the 1×1-MMI light waveguide structure which exhibits a gain and outputs the single-transverse-mode light is realized in the MMI region width of 10 μm.

When the conventional single-transverse-mode LD has the layer structure similar to that of this embodiment, the width of the waveguide is limited to about 2 μm all over the element. Namely, the waveguide must be formed to almost the same width of the both ends 2 and 3 of this embodiment in its total length.

However, since the LD of this embodiment is designed such that the LD operates as the 1×1-MMI as described above, the LD of this embodiment can oscillate single-transverse-mode light (basic mode light) in spite of a waveguide width of 10 μm, which is five times that of the conventional one. In the LD of this embodiment, by utilizing the MMI principle, the waveguide width can be made broad, and the limitation to the saturated injection electric current value can be improved so that high output performance of the LD can be achieved by an injection of high electric current. Moreover, since the LD of this embodiment is constructed such that a multi-mode waveguide region exhibiting the very strong light confinement is included therein, the overlapping integration of the electric field and optical field in the LD is increased, in addition to the significant reduction in the threshold electric current density, whereby the electric/light conversion efficiency can be improved compared to the ordinary single-transverse-mode LD.

The layer structure of the LD of this embodiment is substantially the same as that of the conventional general LD except for the width of the multi-mode waveguide region. The LD of this embodiment can be manufactured through substantially the same steps as those for the conventional general LD, as long as the width and length of the multi-mode waveguide region are determined by utilizing the MMI theory. Therefore, the LD of this embodiment can be manufactured simply by using the already established manufacturing method that is relatively easy so that the LD can achieve an excellent reproducibility and a high yield. Since the LD of this invention has a relatively simple structure, it is suitable for integrated optic devices.

Though the LD of this embodiment has a simple buried structure, the present invention is not limited to this structure. For example, the present invention can be satisfactorily applied also to LD adopting a DC-PBH (Double Channel Planner Buried Heterostructure) which is excellent for blocking of an electric leakage current. Although the wavelength of the LD of this embodiment is 1.5 μm band, the wavelength thereof is not limited to this band, and the present invention can be applied to those of visible light band, near infrared light band, and so on.

As the manufacturing method, although the MOVPE method is adopted for the crystal epitaxial method in this embodiment, the present invention is not limited to this method. For example, an MBE (Molecular Beam Epitaxy) method may be used. Moreover, in this embodiment, the RIE method is adopted as the mesa formation method. However, the present invention is not limited to this method, as a wet etching method may be used.

While a preferred embodiment of the present invention has been described using specific terms, such description is for illustrative purposes only, and it is to be understood that changes and variations may be made without departing from the spirit or scope of the following claims.

What is claimed is:

1. A laser diode which outputs single-transverse-mode light comprising:

a multi-mode interference light waveguide region, amplifying transverse-mode light oscillating within said laser diode, said multi-mode interference light waveguide region having a length L and a width $W_1$, the length L corresponding to the width $W_1$ according to:

$$L = \left(\frac{3}{4N}\right)L_\pi$$

$$L_\pi = \frac{4N_r W_e^2}{3\lambda_0}$$

$$W_e = W_1 + \left(\frac{\lambda_0}{\pi}\right)\left(\frac{N_c}{N_r}\right)^{2\sigma}(N_r^2 - N_c^2)^{-\frac{1}{2}}$$

a first single-transverse-mode light waveguide region connected to a first end portion of said multi-mode interference light waveguide region; and a second single-transverse-mode light waveguide connected to a second end portion of said multi-mode interference light waveguide region, said second end portion being opposite to said first end portion, wherein said multi-mode interference light waveguide region is wider than said first single-transverse mode waveguide region, and wider than said second single-transverse mode waveguide region, wherein said multi-mode interference light waveguide region operates as a 1×N light waveguide, wherein N is a number of single-transverse light waveguide regions connected to said second end portion of said multi-mode interference light waveguide region, $W_e$ is an effective width of said multi-mode interference light waveguide region, $L_\pi$ is a beat length of two lowest order modes, $\lambda_0$ is a wavelength of said single-transverse-mode light, $N_c$ is a refractive index of a cladding portion of said multi-mode interference light waveguide region, $N_r$ is a refractive index of a waveguide portion of said multi-mode interference light waveguide region, σ=0 at a TE mode, and σ=1 at a TM mode, and wherein single-transverse-mode light entering said multi-mode interference light waveguide from said first single-transverse-mode light waveguide region couples to said second single-transverse-mode light waveguide region.

2. The laser diode according to claim 1, wherein N=1, said multi-mode interference light waveguide region being a 1×1 multi-mode interference light waveguide, and wherein only a single-transverse-mode propagates at the first and second end portions of said multi-mode interference light waveguide region.

3. The laser diode according to claim 2, wherein an optical field of single-transverse-mode light entering said multi-mode interference light waveguide from said first single-transverse-mode light waveguide region is identically imaged at said second single-transverse-mode light waveguide region.

4. A laser diode which outputs single-transverse-mode light comprising:

a multi-mode interference light waveguide region, amplifying transverse-mode light oscillating within said laser diode, said multi-mode interference light waveguide region having a length L and a width $W_1$, the length L corresponding to the width $W_1$ according to:

$$L = \left(\frac{3}{N}\right)L_\pi$$

$$L_\pi = \frac{4N_r W_e^2}{3\lambda_0}$$

-continued $$W_e = W_1 + \left(\frac{\lambda_0}{\pi}\right)\left(\frac{N_c}{N_r}\right)^{2\sigma}(N_r^2 - N_c^2)^{-\frac{1}{2}}$$

a first single-transverse-mode light waveguide region connected to a first end portion of said multi-mode interference light waveguide region; and a second single-transverse-mode light waveguide connected to a second end portion of said multi-mode interference light waveguide region, said second end portion being opposite to said first end portion, wherein said multi-mode interference light waveguide region is wider than said first single-transverse mode waveguide region, and wider than said second single-transverse mode waveguide region, wherein said multi-mode interference light waveguide region operates as a N×N light waveguide, wherein N is a number of single-transverse light waveguide regions connected per end portion at the first and second end portions of said multi-mode interference light waveguide region, $W_e$ is an effective width of said multi-mode interference light waveguide region, $L_{90}$ is a beat length of two lowest order modes, $\lambda_o$ is a wavelength of said single-transverse-mode light, $N_c$ is a refractive index of a cladding portion of said multi-mode interference light waveguide region, $N_r$ is a refractive index of a waveguide portion of said multi-mode interference light waveguide region, σ=0 at a TE mode, and σ=1 at a TM mode, and wherein single-transverse-mode light entering said multi-mode interference light waveguide from said first single-transverse-mode light waveguide region couples to said second single-transverse-mode light waveguide region.

5. The laser diode according to claim 4, wherein N=1, said multi-mode interference light waveguide region being a 1×1 multi-mode interference light waveguide, and wherein only a single-transverse-mode propagates at the first and second end portions of said multi-mode interference light waveguide region.

6. The laser diode according to claim 5, wherein an optical field of single-transverse-mode light entering said multi-mode interference light waveguide from said first single-transverse-mode light waveguide region is identically imaged at said second single-transverse-mode light waveguide region.

* * * * *